United States Patent [19]

Gulati et al.

[11] Patent Number: 4,506,165

[45] Date of Patent: Mar. 19, 1985

[54] NOISE REJECTION SET-RESET FLIP-FLOP CIRCUITRY

[75] Inventors: Surender K. Gulati, Catasauqua; Clayton E. Schneider, Jr., Bethlehem, both of Pa.

[73] Assignee: AT&T Bell Laboratories, Murray Hill, N.J.

[21] Appl. No.: 393,764

[22] Filed: Jun. 30, 1982

[51] Int. Cl.³ .................... G11C 11/40; H03K 17/16; H03K 17/693
[52] U.S. Cl. .............................. 307/272 A; 307/279; 307/291; 307/443; 307/481
[58] Field of Search .................... 307/200 A, 443, 448, 307/453, 481, 568, 575, 581, 272 A, 279, 291; 377/115, 116

[56] References Cited

U.S. PATENT DOCUMENTS

| | | | |
|---|---|---|---|
| 3,976,949 | 8/1976 | Hepworth et al. | 307/448 X |
| 4,300,060 | 11/1981 | Yu | 307/279 X |
| 4,349,753 | 9/1982 | Scavuzzo | 307/272 A |

Primary Examiner—John S. Heyman
Assistant Examiner—David R. Hudspeth
Attorney, Agent, or Firm—Irwin Ostroff

[57] ABSTRACT

Set-Reset Master-Slave Flip-Flop circuitry uses a feedback circuit connected to a circuitry output terminal and to set and reset input terminals to limit the effect of spurious signals such that only signals applied to set and reset terminals which are of the appropriate state at least prior to and during the transition of a clock signal from the low to the high state cause the output terminals of the Flip-Flop to be set to or maintained in preselected levels.

8 Claims, 4 Drawing Figures

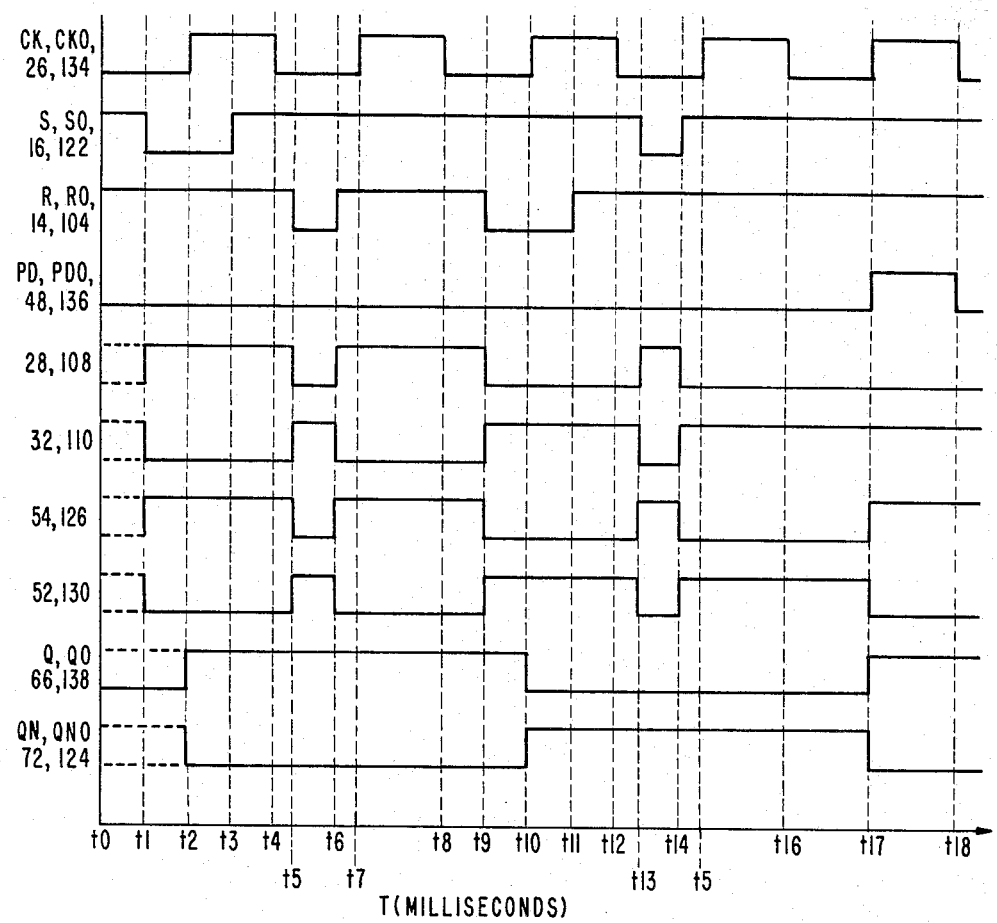

NOISE REJECTION SET-RESET FLIP-FLOP CIRCUITRY

BACKGROUND OF THE INVENTION

This invention relates to logic circuitry and in particular to memory circuitry which limits adverse effects of spurious signals.

Commonly used clocked Set-Reset Master-Slave Flip-Flop circuits set the complementary output terminals to selected logic levels in response to the set and/or reset terminals being set to a high state. Typically during a high "1" level of a clock signal used with the Flip-Flop the output signal levels of the master section can be modified in response to signals applied to the set or reset terminals. Once the set or reset input terminals reach the high level, the outputs of the master section of the Flip-Flop are set to the selected logic level and stay at selected levels even if the set or reset terminal returns to a low "0" level while the clock is still at a high "1" level. After the outputs of the master section are so modified and the clock signal goes a "1", the slave section then acts in response to signals received from the master section to set the output terminals of the Flip-Flop to the desired levels. Spurious signals at the set and reset terminals can cause the Flip-Flop to assume an incorrect state and to stay at that state even after the spurious signal has dissipated. This can introduce errors into systems used with the Flip-Flop.

It is desirable to have a Set-Reset Master-Slave Flip-Flop in which the output logic levels are not changed unless signals at the set and reset input terminals remain at a selected level from at least just before to after a transition of the clock signal which allows information to be transferred from the master section to the slave section.

SUMMARY OF THE INVENTION

The present invention is directed to Set-Reset Master-Slave Flip-Flop circuitry which uses feedback circuit means having first and second input terminals coupled to set and reset input circuitry terminals, respectively, having a third input terminal coupled to an output terminal of the circuitry, and having an output terminal coupled to an input terminal of a master section of the circuitry.

The feedback circuit means is adapted to maintain or to modify the logic state at the output terminal thereof in response to the logic states applied to the three input terminals such that if the logic state at the set or reset input terminals changes state and then returns to the original state, the state of the feedback circuit is set to or remains at the logic state which resulted from the original state of the set or reset input terminal. While a clock signal used with the circuitry is in a first logic state, the signal at the input of the feedback circuit means causes information stored in the master section of the circuitry to be modified, but information stored in a slave section of the circuitry cannot be modified. When the clock signal switches to a second logic state, information stored in the slave section can be modified in accordance with the signal at the output of the master section, but information stored in the master section cannot be modified.

With a first logic level applied to the set or reset input terminals, the circuitry output terminal is eventually set or maintained at a preselected first or second logic state. In order to set or maintain the circuitry output terminal logic state, it is necessary to apply a first logic state to the set or reset input terminals during the time the clock signal is in a first logic state and to maintain the input logic state until the clock signal makes a transition to a second logic state. Signals occurring at the set and/or reset terminals which are not maintained at the first logic state from just before to after the clock makes a transition from the first logic state to the second logic state have no effect on the output state of the circuitry. Accordingly, many noise and other spurious signals cannot cause the output of the circuitry to assume an incorrect logic state.

These and other features and advantages of the present invention are better understood from a consideration of the following detailed description taken in conjunction with the accompanying drawings.

BRIEF DESCRIPTION OF THE DRAWINGS

FIG. 3 illustrates various logic waveforms applied to and generated by the embodiments of FIGS. 1 and 2; and FIG. 4 illustrates a truth table for the embodiments of FIGS. 1 and 2.

DETAILED DESCRIPTION

Figure 1:
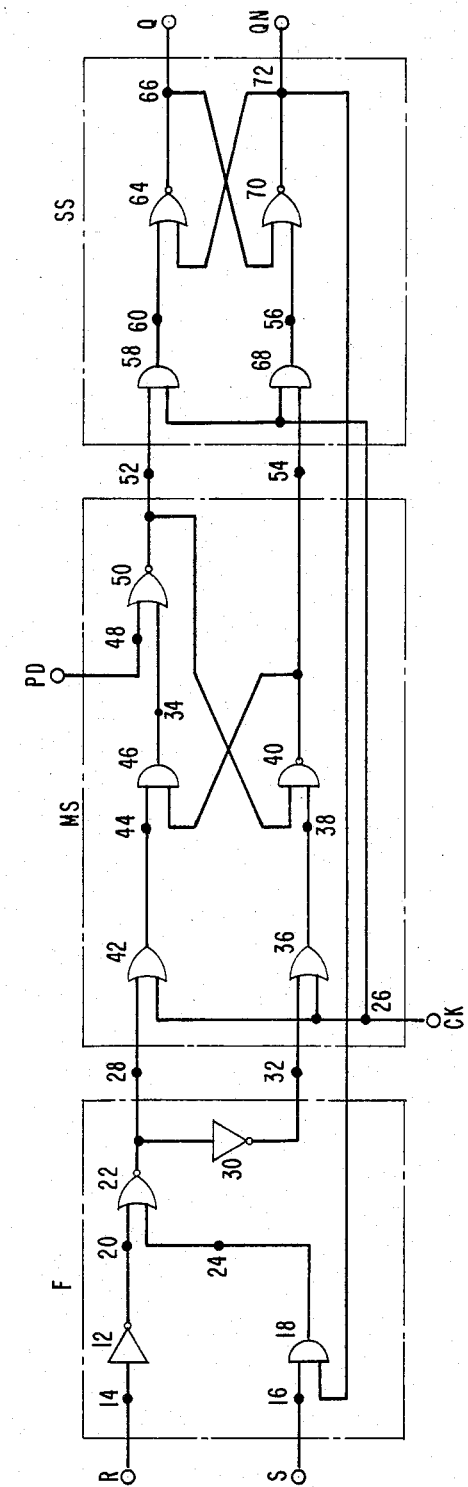
FIG. 1 illustrates in logic block diagram form one embodiment of the present invention.

Referring now to FIG. 1, there is illustrated in logic block diagram form R-S Master-Slave Flip-Flop circuitry 10 which comprises a master section (illustrated within the dashed line rectangle MS), a slave section (illustrated within the dashed line rectangle SS), and a feedback circuit (illustrated within the dashed line rectangle F). An input reset terminal R is coupled to a terminal 14, and an input set terminal S is coupled to a terminal 16. An output terminal Q is coupled to a terminal 66, and a complementary output terminal QN is coupled to a terminal 72. Circuitry 10 is unique in that unlike commonly used R-S Master-Slave Flip-Flops, spurious signals appearing at the S and R input terminals will not cause output terminals Q and QN to change state unless the potential of the S and R terminals remain at a preselected level from the time which a clock signal used with the Flip-Flop makes a transition from one state to the other.

Feedback circuit F comprises essentially a first inverter 12, a two-input NOR gate 22, a second inverter 30, and a two-input AND gate 18. Master stage MS comprises essentially two two-input OR circuits 36 and 42, a two-input AND gate 46, a two-input NAND gate 40, and a two-input NOR gate 50. Slave stage SS comprises two two-input AND gates 58 and 68 and two two-input NOR gates 64 and 70, respectively.

An input terminal 14 is coupled to an input terminal of inverter 12 and to a source of reset signals R. The output terminal of inverter 12 is coupled to a first input terminal of NOR gate 22 and to a terminal 20. A second input terminal of NOR gate 22 is coupled to an output terminal of AND gate 18 and to a terminal 24. A first input terminal of AND gate 18 is coupled to a terminal 16 and to a source of set signals S. A second input terminal of AND gate 18 is coupled to output terminal 72. The output terminal of NOR gate 22 is coupled to an input of inverter 30, to a first input of OR gate 42, and to a terminal 28. A second input terminal of OR gate 42 is coupled to a second input terminal of OR gate 36 and to a terminal 26 which is coupled to a source of clock signals CK. The output terminal of inverter 30 is coupled to a second input terminal of OR gate 36 and to a terminal 32. An output terminal of OR gate 42 is coupled to a first input terminal of AND gate 46 and to a terminal 44. An output terminal of AND gate 46 is coupled to a second input terminal of NOR gate 50 and to a terminal 34. A first input terminal of NOR gate 50 is coupled to a terminal 48 and to a source of precharging signals PD. An output terminal of OR gate 36 is coupled to a second input terminal of NAND gate 40 and to a terminal 38. A first input terminal of NAND gate 40 is coupled to an output terminal of NOR gate 50, a first input terminal of AND gate 58, and to a terminal 52. A second input terminal of AND gate 46 is coupled to an output terminal of NAND gate 40, to a first input of AND gate 68, and to a terminal 54. Second input terminals of AND gates 58 and 68 are both connected to terminal 26. An output terminal of AND gate 58 is coupled to a second input terminal of NOR gate 64 and to a terminal 60. An output terminal of AND gate 68 is coupled to a second input terminal of NOR gate 70 and to a terminal 56. An output terminal of NOR gate 64 is coupled to a first input terminal of NOR gate 70, to terminal 66, and to the Q output terminal. A second input terminal of NOR gate 64 is coupled to an output terminal of NOR gate 70, to terminal 72, and to the QN output terminal.

Figure 2:
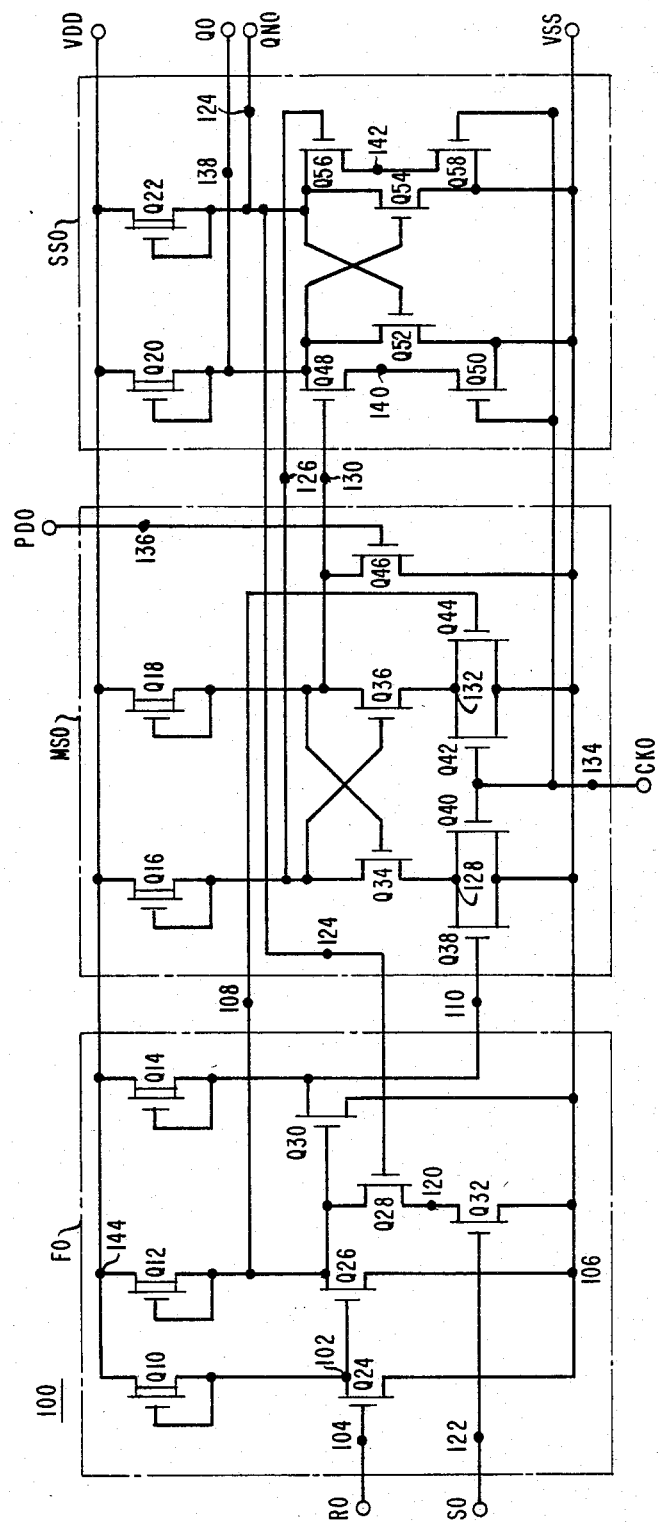
FIG. 2 illustrates a preferred circuit configuration of one embodiment of the present invention.

Referring now to FIG. 2, there is shown in electrical schematic form a preferred embodiment of an R-S Master-Slave Flip-Flop circuit 100. Circuit 100 performs the same functions of circuit 10 of FIG. 1 and comprises a feedback circuit (illustrated within the dashed line rectangle FO), a master section (illustrated within the dashed line rectangle MSO), and a slave section (illustrated within the dashed line rectangle SSO). These three portions of circuit 100 correspond to the three portions of circuit 10 of FIG. 1 which have the same reference identification without the "0" at the end.

Circuit 100 comprises depletion mode n-channel MOS transistors Q10, Q12, Q14, Q16, Q18, Q20, and Q22 and enhancement mode n-channel MOS transistors Q24, Q26, Q28, Q30, Q32, Q34, Q36, Q38, Q40, Q42, Q44, Q46, Q48, Q50, Q52, Q54, Q56, and Q58.

A reset input terminal RO is coupled to the gate of Q24 and to a terminal 104. A set input terminal SO is coupled to the gate of Q32 and to a terminal 122. The sources of Q24, Q26, Q30, Q32, Q40, Q42, Q44, Q46, Q50, Q52, Q54, and Q58 are coupled to a terminal 106 and to a potential source VSS. The drains of Q10, Q12, Q14, Q16, Q18, Q20, and Q22 are coupled to a terminal 144 and to a second power supply VDD. VDD is typically the most positive voltage used with circuit 100, and VSS is typically ground potential. The gate and source of Q10 are coupled to the gate of Q26, to the drain of Q24, and to a terminal 102. The gate and source of Q12 are coupled to the drain of Q26, to the gates of Q30 and Q44, to the drain of Q28, and to a terminal 108. The source of Q28 is coupled to the drain of Q32 and to a terminal 120. The gate of Q28 is coupled to the source and gate of Q22, to the drains of Q54 and Q56, to the gate of Q52, and to a terminal 124 which serves as the QNO output terminal of circuitry 100. The gate and source of Q14 are coupled to the drain of Q30, to the gate of Q38, and to a terminal 110. The gate and source of Q16 are coupled to the gates of Q36 and Q56, to the drain of Q34, and to a terminal 126. The source of Q34 is coupled to the drains of Q38 and Q40 and to a terminal 128. The gate of Q34 is coupled to the source and gate of Q18, to the drains of Q36 and Q46, to the gate of Q48, and to a terminal 130. The source of Q36 is coupled to the drains of Q42 and Q44 and to a terminal 132. The gate of Q46 is coupled to a terminal 136 which is coupled to a source of presetting potentials PDO. The gate and source of Q20 are coupled to the drains of Q48 and Q52, to the gate of Q54, and to a terminal 138 which serves as the output terminal Q0. The source of Q56 is coupled to the drain of Q58 and to a terminal 142. The gates of Q40, Q42, Q50, and Q58 are coupled to a terminal 134 and to a source of clock signals CKO.

Referring now to FIG. 3, there are illustrated logic waveforms applied to or appearing at, and/or generated by, the embodiments of FIGS. 1 and 2 as a function of time. The set and reset input terminals S, SO, R, RO are normally held at a high logic level, a "1", if it is desired that there be no change in the output terminals Q, QO and QN, QNO. If the set input terminals S, SO are at a low level, a "0", and are maintained at same level from the time the clock terminals CK, CKO make transitions from a "0" to a "1", the output terminals Q, QO and QN, QNO are set to a "1" and a "0", respectively. Between T=t2− and T=t2+, S and SO are "0"s and CK and CKO make transitions from "0"s to "1"s. This causes Q, QO and QN, QNO to be set to "1"s and "0"s, respectively, at T=t2+. The signal appearing at the reset terminals R, RO between T=t5 and T=t6 occurs while CK and CKO are "0"s, and as a result, the Q, QO and QN, QNO output terminals stay at the previously set "1" and "0" levels. If the set input terminals S, SO are "1"s, as is the case from T=t3+ and T=t13 −, and the reset input terminals R, RO are set to "0"s from T=t9 to T=t11, then Q, QO and QN, QNO assume a "0" and a "1" level, respectively, at T=t10+. A "0" level signal applied to or occurring at the S and SO input terminals while the clock is a "0" does not change the Q, QO and QN, QNO output terminal logic levels. For example, the S, SO input signal occurring between T=t13 at T=t14 causes no change in the Q, QO and QN, QNO output terminal logic levels which remain at the previously attained "0" and "1" levels, respectively. During the period of T=t17+ to T=t18−, PD and PDO are at "1"s. This causes the Q and QO outputs to be set to or be maintained at the "1" level and causes QN and QNO to be set to or be maintained at the "0" level.

The embodiments of FIGS. 1 and 2 are designed such that input "0" level signals on the set and reset input terminals only affect the Q, QO and QN, QNO output terminal waveforms when said input signals occur while the clock is a "0", and same input signals are maintained at the "0" level until the clock makes a transition to the "1". Accordingly, the embodiments of FIGS. 1 and 2 are essentially immune to noise or spurious signals unless said signals meet the criteria above described.

Referring now to FIG. 4, there is illustrated a truth table which is applicable to the embodiments of FIGS. 1 and 2. If the clock CK, CKO is a "0", then the Q, QO and QN, QNO outputs remain at whatever levels they had previously, independent of the logic state of the set, reset, and precharge input logic levels. If S,SO=R,RO="1" and PD,PDO="0", and the clock CK, CKO is switched from a "0" to a "1", then the Q, QO and QN, QNO output terminals stay at the initial levels. If CK,CKO=PD,PDO="1", then the Q, QO and QN, QNO output terminals are set or maintained at the "1" and "0" levels, respectively, independent of the logic states of the S, SO and R, RO input terminals.

If R,RO="1", PD,PDO="0", and if S,SO="0" while CK, CKO makes a transition from a "0" to a "1", Q, QO and QN, QNO assume or are maintained at a "1" and "0" level, respectively.

If S,SO="1" and PD,PDO="0", and if R,RO="0" while CK, CKO makes a transition from a "0" to a "1", Q, QO and QN, QNO assume or are maintained at a "0" or a "1" level, respectively.

If S,SO=R,RO=PD,PDO="0", and CK, CKO makes a transition from a "0" to a "1", Q, QO and QN, QNO assume or are maintained at a "1" and a "0", respectively. This condition does not normally occur since generally the set and reset terminals are selected to be both "1's", or just one of the two assumes a "0" level.

Circuitry 100 of FIG. 2 has been fabricated as part of a silicon integrated circuit and has been tested and found to be functional. The integrated circuit version of circuitry 100 used n-channel depletion and enhancement mode transistors with VDD=5 volts, VSS=0 volts, and a "1" level of 5 volts and a "0" level of 0 volts.

It is to be understood that the embodiments described herein are merely illustrative of the general principles of the invention. Various modifications are possible within the scope of the invention. For example, the feedback circuitry of FIG. 1 can be fabricated using CMOS circuitry, bipolar circuitry, PMOS circuitry, or other available circuitry. Still further, separate nonoverlapping clock signals can be used with the master and slave sections, and both sections can be responsive to the same logic level of the two clock signals. Still further, various other master-slave type flip-flops can be substituted for those illustrated.

What is claimed is:

1. Set-reset master-slave flip-flop circuitry comprising:
    a master section having an output terminal coupled to an input terminal of a slave section;
    a first circuitry output terminal being coupled to the slave section;
    feedback circuit means having first and second input terminals which serve as circuitry set and reset input terminals, respectively, a third input terminal which is coupled to the first circuitry output terminal and serves as a feedback input terminal, and an output terminal which is coupled to an input terminal of the master section;
    the feedback circuit means being characterized such that same results in the logic level of the circuitry output terminal being selectively maintained;
    the master and slave sections both being designed to receive a clock signal which has two different logic levels;
    the master section being characterized in that same modifies or maintains the logic level of the output terminal thereof in response to signals occurring at the input terminal thereof during a first logic level of the clock signal but only maintains the logic level of the output terminal thereof during the second logic level of the clock signal;
    the slave section being characterized in that same modifies or maintains the logic level of the output terminal thereof in response to a signal received at the input terminal thereof during the second logic level of the clock signal but only maintains the logic level of the output terminal thereof during the first logic level of the clock signal;
    the circuitry being characterized by maintaining or modifying the logic level of the output terminal thereof in response to the logic levels applied to the set, reset, and feedback input terminals such that if the logicc level of the set or reset input terminals changes and then returns to the original logic level, then the logic level of the output terminal of the feedback circuit means assumes or maintains the logic level which resulted from the original logic level occurring at the set or reset input terminals such that the circuitry output terminal cannot change logic level unless a signal occurring at the set or reset input terminals maintains the second logic level during the time the clock signal makes a transition from one logic level to the other logic level.

2. The circuitry of claim 1 wherein:
    the feedback circuit means comprises a first inverter circuit having an input terminal and an output terminal; an AND gate having first and second input terminals and having an output terminal; and a NOR gate having a first input terminal coupled to the output terminal of the first inverter circuit and having a second input terminal coupled to the output terminal of the AND gate and having a first output terminal coupled to a first input terminal of the master section;
    the input terminal of the first inverter circuit serving as the circuitry reset input terminal;
    the first input terminal of the AND gate serving as the circuitry set input terminal;
    the second input terminal of the AND gate being coupled to the first output terminal of the circuitry.

3. The circuitry of claim 2 further comprising a second inverter circuit having an input terminal coupled to the output terminal of the NOR gate and having an output terminal coupled to a second input terminal of the master section.

4. The circuitry of claim 3 wherein:
    a second circuitry output terminal is coupled to the slave section; and
    the circuitry is characterized such that during operation complementary signals are generated at the first and second circuitry output terminals.

5. The circuitry of claim 1 or 4 wherein:
    the feedback circuit means comprises first, second, and third depletion mode field effect transistors each having a gate terminal coupled to a source terminal thereof and having all drain terminals thereof coupled together;
    first, second, third, fourth, and fifth enhancement mode field effect transistors;
    source terminals of the first, second, fourth, and fifth enhancement mode transistors being coupled together;
    a source terminal and a gate terminal of the first depletion mode transistor being coupled to a drain terminal of the first enhancement mode transistor and to a gate terminal of the second enhancement mode transistor;
    a source terminal and a gate terminal of the second depletion mode transistor being coupled to drain terminals of the second and third enhancement mode transistors, to a gate terminal of fifth enhancement mode transistor, and to a first input terminal of the master section;

the gate terminals of first and fourth enhancement mode transistors being coupled to the reset and set input terminals, respectively;

the gate terminal of the third enhancement mode transistor being coupled to the first circuitry output terminal;

a source terminal of the third enhancement mode transistor and a drain terminal of the fourth enhancement mode transistor being coupled together; and a source terminal and a gate terminal of the third depletion mode transistor being coupled to a drain terminal of the fifth enhancement mode transistor, and to a second input terminal of the master section.

6. The circuitry of claim 5 wherein the master and slave sections and the feedback circuitry all comprise n-channel transistors.

7. Circuitry comprising:

a master section and a slave section each being capable of storing information and each having at least one input and one output terminal;

an output terminal of the master section being coupled to an input terminal of the slave section;

an output terminal of the slave section serving as a circuitry output terminal;

feedback circuit means having a first input terminal, a second input terminal, and a third feedback input terminal, and having an output terminal;

the feedback circuit means being characterized such that same results in the logic level of the output terminal being selectively maintained;

the first and second input terminals of the feedback circuit means serving as a first and second circuitry input terminals;

the third input terminal of the feedback circuit means being coupled to the circuitry output terminal;

the output terminal of the feedback circuit means being coupled to an input terminal of the master section;

the master and slave sections each being designed to receive a clock signal having two different logic levels with each section being responsive to a different one of the two logic levels of the clock signal;

the master section being characterized such that with the clock signal being in the first logic level, same modifies or maintains information previously stored therein in response to a signal applied to the input terminal thereof;

the master section being further characterized such that with the clock signal being in the second logic level, same maintains information previously stored therein;

the slave section being characterized such that with the clock signal being in the first logic level, same maintains information previously stored therein;

the slave section being further characterized such that with the clock signal being in the second logic level, same modifies or maintains information previously stored therein as a function of information received from the output terminal of the master section; and the circuitry being characterized such that signals occurring at the first and second input terminals which start at one logic level, make a first transition to a second logic level, and then make a second transition back to the first logic level, can only modify the logic level of the circuitry output terminal if the clock signal makes a transition from one logic level to the other while the first or second input terminals are at the second logic level.

8. Circuitry comprising:

a master section and a slave section each being capable of storing information and each having at least one input and one output terminal;

an output terminal of the master section being coupled to an input terminal of the slave section;

an output terminal of the slave section serving as a circuitry output terminal;

feedback circuit means having a first input terminal, a second input terminal, and a third feedback input terminal, and having an output terminal;

the feedback circuit means being characterized such that same results in the logic level of the circuitry output terminal being selectively maintained;

the first and second input terminals of the feedback circuit means serving as first and second circuitry input terminals;

the third input terminal of the feedback circuit means being coupled to the circuitry output terminal;

the output terminal of the feedback circuit means being coupled to an input terminal of the master section;

the master section being characterized to receive and to be responsive to only one logic level of a two logic level first clock signal;

the slave section being characterized to receive and to be responsive to the other logic level of a two logic level second clock signal;

the first and second clock signals being so timed such that the logic levels of each, which cause the master section of the slave section to be responsive, do not overlap; and the circuitry being characterized such that signals occurring at the first or second input circuitry terminals which start at one logic level, make a transition to a second logic level, and then make a second transition back to the first logic level, only modify the logic state of the circuitry output terminal if the first clock signal makes a transition from the logic level which makes the master section responsive to the other logic level which makes the slave section responsive while the first or second input terminals are at the second logic level.

* * * * *